United States Patent [19]

Tustison et al.

[11] Patent Number: 4,857,415
[45] Date of Patent: Aug. 15, 1989

[54] METHOD OF PRODUCING SINGLE CRYSTALLINE MAGNETIC FILM HAVING BI-AXIAL ANISOTROPY

[75] Inventors: Randal W. Tustison, Lexington; Thomas Varitimos, Norwood, both of Mass.

[73] Assignee: Raytheon Company, Lexington, Mass.

[21] Appl. No.: 56,618

[22] Filed: May 29, 1987

[51] Int. Cl.$^4$ .................... H01L 29/12; B32B 15/01
[52] U.S. Cl. .................................. 428/620; 428/642
[58] Field of Search ........................... 428/620, 642

[56] References Cited

U.S. PATENT DOCUMENTS 3,573,485 4/1971 Ballard.
3,788,890 1/1974 Mader et al. ................... 437/13 X

OTHER PUBLICATIONS

"Technology of Ion Beam Sources Used in Sputtering" by Harold R. Kaufman, J. Vac. Sci. Technol., 15(2), American Vacuum Society, Mar./Apr. 1978, pp. 272-276.
"Interface Chemistry of Metal-GaAs Schottky-Barrier Contacts" by J. R. Waldrop et al., Appl. Phys. Lett., 34(10), American Institute of Physics, May 1979, pp. 630-632.
"Magnetoresistance Effect of Ni-Fe Film Formed by Ion Beam Sputtering", by Yasuhiro Nagai et al., J. Vac. Sci. Technol., A 4(5), American Vacuum Society, Sep.-/Oct. 1986, pp. 2364-2368.
"Properties of Fe Single-Crystal Films Grown on (100) GaAs by Molecular-Beam Epitaxy" by J. Krebs et al., J. Appl. Phys., 61(7), Apr. 1, 1987, pp. 2596-2599.
"Iron Thin Films by Means of Dual Ion-Beam Sputtering" by M. Yamaga et al., IEEE Translation Journal on Magnetics in Japan, vol. TJMJ-1, No. 4, Jul. 1985, pp. 488-490.
"X-Ray Characterization of Single-Crystal Fe Films on GaAs Grown by Molecular Beam Epitaxy", by S. B. Qadri et al., J. Vac. Sci. Technol. B, vol. 3, No. 2, Mar.-/Apr. 1985, pp. 719-721.
"Molecular Beam Epitaxial Growth of Single-Crystal Fe Films on GaAs", by G. A. Prinz et al., App. Phys. Lett., 39(5), Sep. 1, 1981, pp. 397-399.
"Single Crystal Fe Films Grown on GaAs Substrates" by W. Wettling et al., Journal of Magnetism and Magnetic Materials, 28, (1982), pp. 299-304.

Primary Examiner—Stephen J. Kalafut
Attorney, Agent, or Firm—Denis G. Maloney; Richard M. Sharkansky

[57] ABSTRACT

A single crystal Fe film is deposited on a (100) gallium arsenide substrate by ion beam sputtering the Fe film. The sputtered Fe atoms are imparted with energies in the range of about 1 electron volt to at least 10 electron volts to impart sufficient kinetic energy to said ions to allow said ions to have high surface diffusion rates, thereby permitting the atoms to be located at the proper lattice sites of the Fe crystal formed over the gallium arsenide substrate.

17 Claims, 4 Drawing Sheets

METHOD OF PRODUCING SINGLE CRYSTALLINE MAGNETIC FILM HAVING BI-AXIAL ANISOTROPY

BACKGROUND OF THE INVENTION

This invention relates generally to epitaxial growth techniques and more particularly to epitaxial growth of metals.

As is known in the art, metallic films such as iron can be grown epitaxially to form single crystal layers on substrates of gallium arsenide in the {110} orientation. The (110) face contains the magnetic easy axis <001>, the magnetic axis hard <111>, and the intermediate axis <110>. In an article entitled "Molecular Beam Epitaxial Growth of Single Crystal Fe Films on GaAs", by Prinz et al, Applied Physics Letter 39 (V) September 1981, the authors describe using molecular beam epitaxy (MBE) to grow single crystal iron films over (110) faces of gallium arsenide. In the molecular beam epitaxy technique as described in the above article, a source of iron is heated to a high temperature (1150° C.) and iron atoms are vaporized over the iron source. In the presence of an ultra-high vacuum, characteristic of the molecular beam epitaxy approach, the vaporized iron atoms migrate towards the substrate. The substrate is generally heated to a temperature in the range of about 50° C. to 450° C. With this technique, the amount of kinetic energy imparted to the iron atoms is related to the amount of kinetic energy imparted to the iron atom during heating of the iron source, and the temperature of the substrate. Typically, the kinetic energy of these iron atoms is in the range of 0.1–0.2 eV.

While growth in the {110} family of planes provide interesting material for use in metallic studies, it is believed the growth in the {100} family of planes, for example the (100) face generally used for device fabrication in gallium arsenide, would be more beneficial. The {100} family of planes include the (100), (010) and (001) faces of the cubic zinc blende gallium arsenide crystal. For example, it has been suggested that multi-layer semiconductor structures may be ultimately fabricated. Such multi-layer structures would involve forming multi-semiconductor epitaxial layers each having devices fabricated thereon, with said devices being interconnected by metallic conductors. Over underlying epitaxial semiconductor layers would then be grown subsequent epitaxial semiconductor layers. In order for the subsequent semiconductor layers to have the same crystal structure as the underlying epitaxial layers, the metallic interconnects would also have to be single crystal layers having a similar crystal orientation as that of the substrate. Therefore, since for device work, the <100> orientation is preferred in materials such as gallium arsenide, for example, it would be advantageous to grow metal layers over gallium arsenide likewise having the <100> orientation.

Furthermore, to exploit the magnetic properties of certain metals such as iron, it would also be advantageous to grow these metals such as iron in the <100> orientation over <100> orientated semiconductor materials such as gallium arsenide. Iron grown on the (100) planes will provide mutually orthogonal, planar crystal orientations in the <010> and <001> orientation. These mutual orthogonal, planes crystal orientations or directions will provide an iron film having a natural bi-axial anisotropy and accordingly, will provide a film having a pair of magnetization states which are easy to magnetize in directions parallel to either one of the <010> or <001> directions but would be difficult to magnetize in the intermediate axies orientations such as the <110> orientation. This characteristic may be used to provide magnetic storage elements, as described in U.S. patent application Ser. No. 57,089 by E. Schloemann, filed on the same day as this application, and assigned to the same assignee as the present invention.

Low substrate temperatures are also desirable because a metal layer may have a substantially different thermal expansion characteristic than the substrate. Upon cooling of the substrate, these differences can lead to crystal strain causing slight misalignment of the atoms in the iron crystal layer which degrades crystal quality.

Low substrate temperatures are also required to prevent low decomposition temperature materials such as GaAs from decomposing during growth of the layer.

SUMMARY OF THE INVENTION

In accordance with the present invention, a method for growing a single crystal layer of metal over the {100} family of planes of a substrate, in particular over (100) faces of the substrate comprises the steps of providing the (100) orientated substrate disposed at a predetermined temperature in a low pressure environment of less than about $10^{-4}$ torr, directing a beam of a high energy sputtered metal atoms having energies generally in the range of at least 1 eV to 100 eV towards the substrate, and forming said metal layer on said substrate by depositing said high energy sputtered metal atoms onto the substrate. With this arrangement, sputtered metal atoms having high kinetic energies are directed towards the substrate. The high kinetic energies of the sputtered metal atoms will enhance the surface diffusion of the atoms on the substrates, enabling the atoms to fill proper lattice positions of the single crystal metal layer grown over the (100) faces of the substrate.

In accordance with a further aspect to the present invention, a method of depositing a single crystal metal film having a (100) orientation over a single crystal (100) orientated substrate comprises the steps of providing a substrate disposed at a predetermined low temperature less than the decomposition temperature of the material of the substrate and a high vacuum environment disposed at a pressure of less than about $10^{-4}$ torr, while directing a beam of ions towards a target comprised of the metal to be deposited, to remove metal atoms from said target by collision impacts with the beam of ions and impart to substantial ones of said metal ions a kinetic energy of at least about one electron volt. The metal ions having the kinetic energy of at least one electron volt are then deposited onto the substrate to form the single crystal <100> orientated metal layer. With this particular arrangement, growth of a single crystal metal film over a <100> orientated semiconductor substrate is provided. By providing low deposition temperatures, the difference in temperature expansion between the crystal of the substrate and the crystal of the metal layer are significantly reduced, thereby reducing the degree of misorientation of atoms in the crystal lattice. Further, this technique will permit subsequent growth of epitaxial growth of semiconductors layers over the metallic layer, thereby permitting multi-layer semiconductor structures having buried metallic interconnects to be fabricated.

In accordance with a further aspect of the present invention, a substrate of (100) gallium arsenide is disposed at a temperature less than the decomposition temperature of the gallium arsenide, and in a low pressure environment. A beam of high energy sputtered metal atoms, having kinetic energies greater than about 1 eV or more is directed towards the substrate. These atoms are deposited on the substrate forming a <100> orientated Fe layer on the substrate. With such an arrangement, a Fe layer have a pair of mutually orthogonal planar crystalline directions is disposed on the (100) face of the gallium arsenide substrate. This film will have a pair of mutually orthogonal remanent magnetization states, the <010> and the <001> directions which correspond to two easy axes of the Fe body centered cubic (bcc) structure. These two directions provide a pair of magnetization directions which are easy to align (i.e. magnetize) thus providing a film having a natural bi-axial anisotropy. Moreover, since the Fe layer is a single (100) crystal, subsequent epitaxial (100) GaAs layers may be provided over the (100) substrate and the (100) Fe layer.

In accordance with a further aspect of the present invention, a method of depositing a single crystalline metal film comprises the steps of providing a substrate disposed at a predetermined temperature in a high vacuum environment. A beam of ions are directed towards a target comprised of the metal to be deposited on the substrate, such that the beam of ions impart to atoms of the material, energies in the range of at least 1 eV to 10 eV. These metal atoms are redeposited from the target onto the substrate while a second beam of relatively low energy ions is directed towards the substrate and collide with the metal atoms to increase the kinetic energy of the metal atoms as they redeposit on the substrate. With this particular arrangement, by providing a second beam of relatively low energy ions, extremely low temperature growth of single crystal metal films over a substrate is provided. This will reduce crystal strain in the metal layer by reducing the degree of mismatch in the crystal lattices of the metal layer and the substrate resulting from thermal expansion coefficient differences between the metal layer and the substrate layer.

BRIEF DESCRIPTION OF THE DRAWINGS

The foregoing features of this invention, as well as the invention itself, may be fully understood from the following detailed description of the drawings, in which.

DESCRIPTION OF THE PREFERRED EMBODIMENTS

Figure 1:
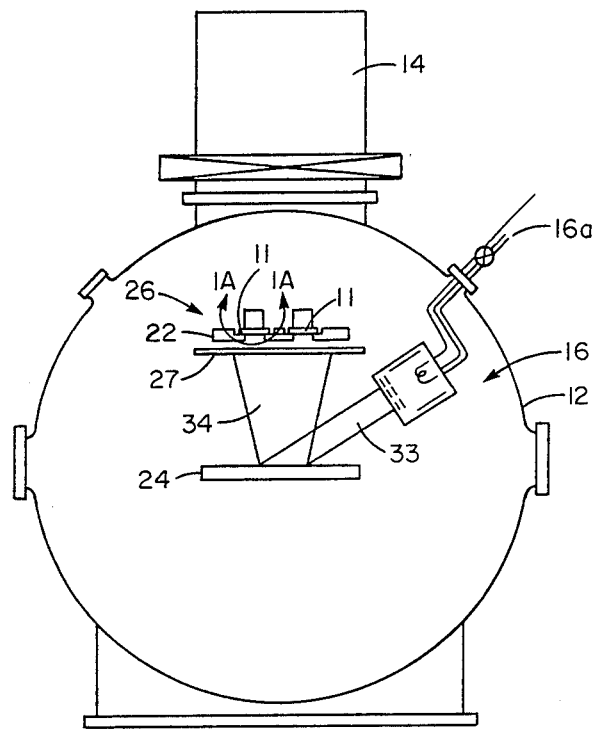
FIG. 1 is a schematic representation of an ion beam sputtering apparatus used to grow a metal layer in accordance with the present invention.
Figure 1A:
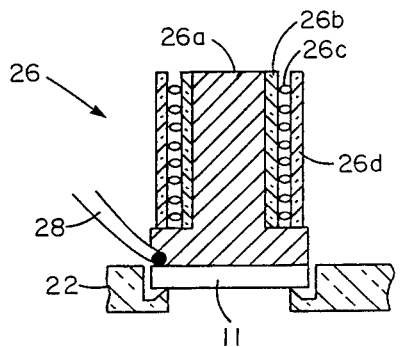
FIG. 1A is an enlarged view taken along line 1A—1A of FIG. 1 showing details of the substrate heater of the apparatus shown in FIG. 1.

Referring now to FIGS. 1, an ion beam sputtering system 10 used for epitaxially growing a thin metal film, here an iron (Fe) film having natural bi-axial anisotropy, over {100} crystal faces of a substrate 11 comprised of gallium arsenide (GaAs), is shown to include an ultra-high vacuum chamber 12 and a cyrogenic pump 14 used to evacuate the vessel to provide an internal atmospheric pressure of about $10^{-9}$ torr. An ion gun 16 here of a broad beamwidth type is disposed within the chamber 12 and is fed via an inlet port 16a with a suitable ion source such as argon gas or another inert gas, as shown. The substrate 11 is mounted in a holder 22 disposed opposite a target 24 here comprised of Fe. Target 24 here has a thickness typically in the range 0.0625 to 0.125" although other thicknesses may also be used. A removable shutter 27 is interposed between the mounted substrate 11 and the target 24. Referring now also to FIG. 1A, the temperature of substrate 11 is controlled by a heater assembly 26 comprising a thermally conductive block member 26a, an insulator 26b, spacing a heater coil 26c, and a glass shield 26d disposed to protect the heater coil 26a, as shown. A thermocouple 28 is embedded between the block 26a and the substrate 11 to sense the temperature of a substrate and thus to control the temperature of the substrate within predetermined temperature limits.

In operation, one or more substrates 11 are disposed in the holder 22 behind the shutter 24, as shown. The vessel is evacuated to provide an internal pressure of at least $5 \times 10^{-8}$ torr. After this vacuum at least has been provided, the vessel is backfilled with an inert gas here argon to a pressure in the range of $8 \times 5^{-5}$ torr to $1 \times 10^{-4}$ torr. Generally, the gas which is used to backfill the vessel is the same gas which is used to provide the species of ions in a manner to be described. The shutter 27 is normally in the closed position, thereby shielding the substrates 11 from the target. Prior to epitaxial growth of the layer over the substrates 11, the substrate 11 is disposed at a predetermined temperature typically here in the range of 215° C. to 355° C. After substrate 11 has been allowed to achieve this temperature, the ion specie gas, here argon, is directed into gas inlet 16a and is fed into the ion gun 16. Emerging from ion gun 16 are accelerated ions 33 here of argon ($Ar^+$) which are directed towards the target 24 and strike an area of the target 24 roughly opposite the substrate 11, as shown. However, at this juncture, the shutter 27 is in its closed position shielding the substrate 11 from the target 24, therefore, the ion strike target 24 and provide a coating of iron on the shutter 27. This predeposit of the Fe on the shutter 27 enables the iron to act as a getter for any free oxygen ($O_2$) remaining in the chamber 12. This will provide epitaxial Fe layers over the substrate having very low concentrations of oxygen within the layers.

After this pregrowth operation, Ar is again let into the ion gun 14 and Ar ions emerge from the gun having electron energies typically in the range of 500 to 2,000 electron volts, which strike the target in region thereof again opposite the substrate 1. Provided as a result of these collisions with the atoms of the target 24 are Fe atoms which sputter off the target 24 having electron energies between about 1 electron volt and 100 electron volts (eV) with a substantial number of those atoms having electron energies within in the range of about 10 eV to 20 eV. These atoms are directed in various directions but principally towards the substrate 11 in the manner as shown by the fan beam 34. The metal atoms accordingly have high kinetic energy which enhances the surface diffusion energy of the atoms on the substrate 11. This allows the Fe atoms to be deposited on proper lattice positions and provides a single crystal {100} Fe layer over the {100} substrate, as shown.

With the substrate 11 orientated in a {100} family of planes, the iron layer deposited over the substrate will be likewise orientated in a {100} family of planes. In particular for device type GaAs <100> orientation misaligned 2° within ±0.5° towards the nearest <110> axis, a orientated layer of Fe will be provided having a pair of directions <010> and <001> disposed in a common plane on the surface of the substrate. This will provide a layer which will allow subsequent growth of single crystal semiconductor insulating material thereover and, moreover, will provide a layer having a natural bi-axial anisotropy.

The ion beam sputtering apparatus 10 has several advantages over other conventional sputtering and growth techniques for producing epitaxial films of metal layers. Firstly, these techniques allows for the growth of high quality single crystal films particularly over <100> orientated semiconductor materials such as gallium arsenide. It is believed the iron atoms are provided with high kinetic energies in a relatively low pressure, low temperature environment, the sputtered Fe atoms to have a long mean free path with high kinetic energies enabling the Fe atoms to have high surface diffusion mobilities and, therefore, allow the iron atoms to deposit at proper lattice sites as the Fe film is grown, even at low substrate temperatures. That is, the high kinetic energies lead to a high surface diffusion energy even at low substrate temperature which is a favorable condition for epitaxial growth. Low substrate temperatures have a further advantage particularly for materials such as gallium arsenide where high temperatures can lead to decomposition of the gallium arsenide or damage to processed wafers. Furthermore, since the Fe film will have different thermal expansion properties than gallium arsenide, lower temperature deposition with high kinetic energy will reduce crystal strain caused by mismatch in the thermal expansion properties of both materials, thus further improving the crystalline properties of the Fe layer.

Further, the Fe film deposited in this manner on the (100) gallium arsenide substrate has a so-called natural anisotropy or bi-axial anisotropy. Iron has a body centered cubic structure whereas gallium arsenide has a cubic structure known as zinc blende structure, and has a lattice constant what is very nearly twice that of Fe providing a sufficiently close lattice match of the Fe film to gallium arsenide. Depositing the Fe film on the (100) surface of the gallium arsenide will provide the (100) surface of the Fe film in a perpendicular nonplanar axes to the gallium arsenide surface, and the <010> direction and <001> direction of the Fe cubic structure in mutually orthogonal, directions disposed in the same plane as the surface of the gallium arsenide. Accordingly, the <010> and <001> directions of the Fe crystal may be used as remnant magnetization states to provide an Fe magnetic thin film material and having a pair of mutually orthogonal remnant magnetization states.

Figure 2:
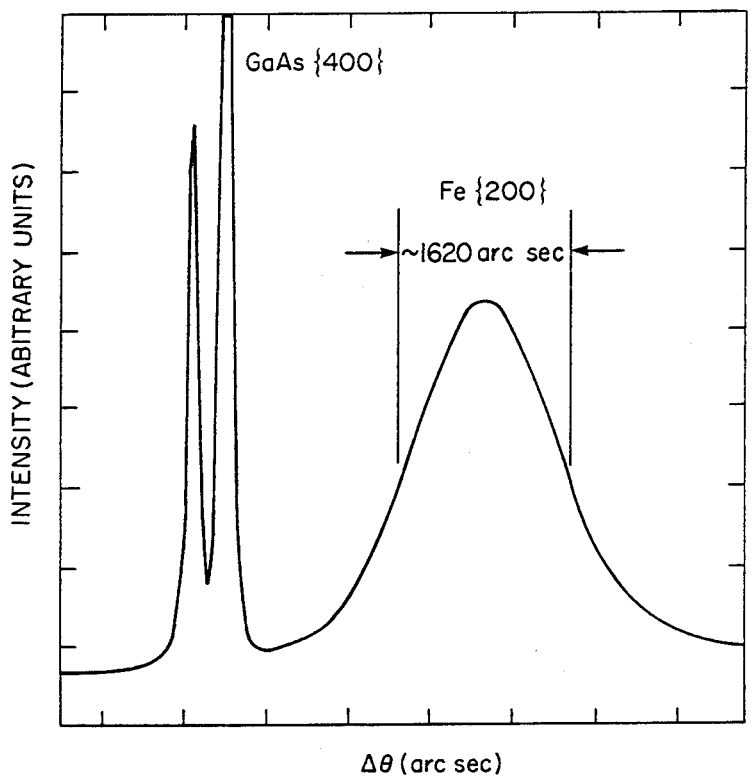
FIG. 2 is a plot of x-ray intensity versus diffraction angle for a film grown as describing in conjunction with FIG. 1.

The single crystal character of the iron films have been shown by means of x-ray and magnetic measurements. Referring to FIG. 2, an x-ray rocking curve obtained on a film having a thickness of 570 nanometers is shown. The presence of a single Fe {200} peak confirms the single crystal nature of the film.

Figure 3:
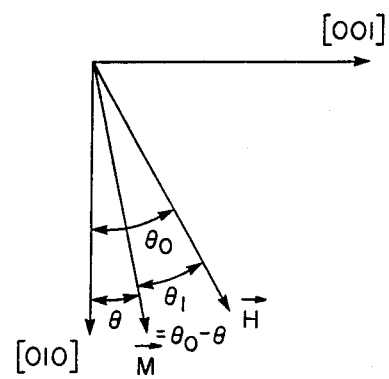
FIG. 3 is a vector diagram which defines the relationship of angles that characterize the orientation of magnetization and magnetic field for the film grown as described in conjunction with FIG. 1.
Figure 4:
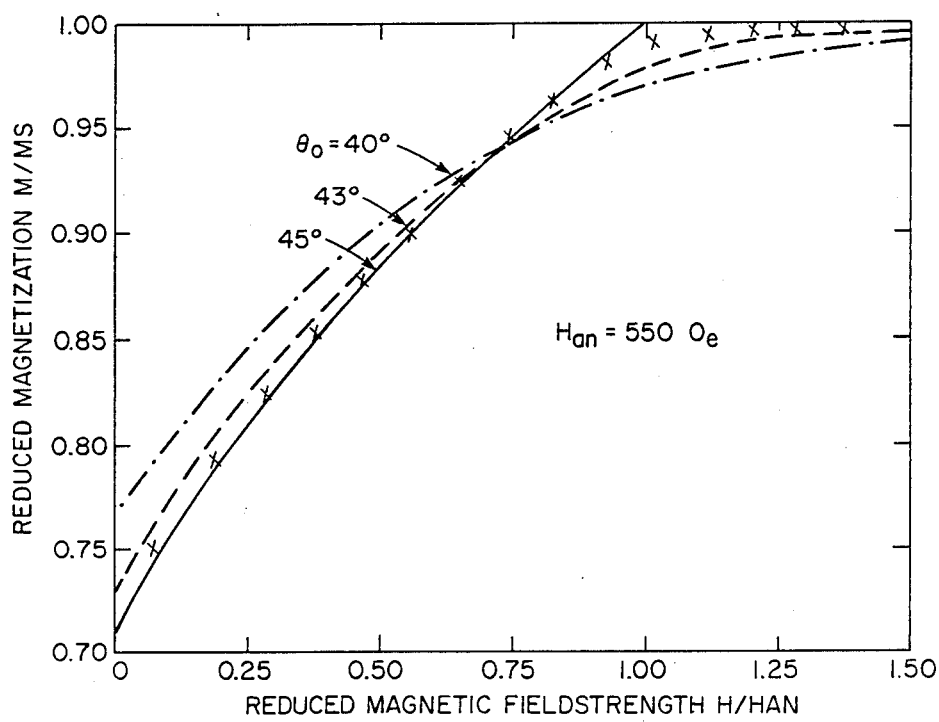
FIG. 4 is a plot of reduced magnetization versus reduced field strength for a film grown as described in conjunction with FIG. 1.
Figure 5:
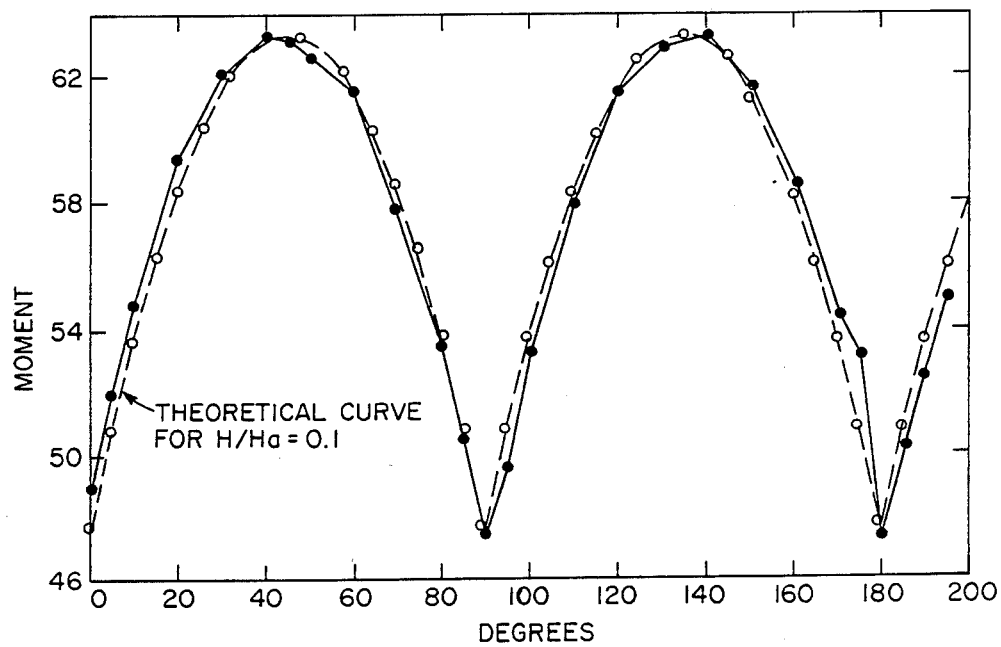
FIG. 5 is a plot of magnetic moment versus orientation of a magnetic field expressed in degrees for a film grown as described in conjunction with FIG. 1 compared to a theoretical value of such a film.

Referring to FIGS. 3–5, the magnetic properties of the films have also been studied by measuring the magnetic moment as a function of orientation and field strength using a vibrating sample magnetometer.

With the magnetic field and hence the magnetic moment in the plane of the film, the anisotropy energy is given by $$E_{anis} = (K_1/4)\sin^2(2\theta) \tag{1}$$

where $K_1$ is the first order anisotropy constant and $\theta$ is the angle between the magnetic moment and one of the in-plane easy axes (for instance <010>, FIG. 3). With the field applied at an angle $\theta_o$ to the in-plane easy axis, the total energy (sum of anisotropy and Zeeman energies) is $$E = \tfrac{1}{4}K_1 \sin^2 2(\theta_0 - \theta_1) - HM_s \cos\theta_1, \tag{2}$$

where $\theta_1$ is the angle between magnetic moment and magnetic field as shown in FIG. 3, H the field strength and $M_s$ the saturation magnetization. The condition for minimal energy $\partial E/\partial\theta_1 = 0$ can be solved explicitly for $\theta_o$ with the result $$\theta_0 = \theta_1 + \tfrac{1}{4}\sin^{-1}\left[\frac{4H}{H_{an}} \cdot \sin\theta_1\right], \tag{3}$$

where $H_{an} = 2K_1/M_s$ is the anisotropy field. The magnetometer measures the projection of the magnetization vector on the magnetic field direction, i.e.

$$\text{magnetic moment } \alpha M_s \cos\theta_1 \tag{4}$$

Equations (3) and (4) can therefore be used to calculate the dependence of the magnetic moment on the strength and orientation of the magnetic field.

The magnetic measurements were performed on a film of 200 nm thickness. FIG. 4 shows the reduced magnetization as a function of field strength when the field is applied along a [011] direction (i.e. along a "hard", in-plane axis). The theoretical curve for $\underline{M}/M_s$ (calculated from (18) and (19)) rises from $1/\sqrt{2}$ (for H=0) to 1 (for $H/H_{an}=1$) and has a discontinuous slope at $H/H_{an}=1$ (solid line labeled $\theta_o=45°$ in FIG. 21). Theoretical curves corresponding to slight misalignment between field and inplane hard direction are shown as broken lines in FIG. 4. The data points (crosses) generally lie between theoretical curves for $\theta_o=45°$ and 43°. The anisotropy field inferred from these measurements is 550 Oe, which agrees with the accepted value for bulk iron.

FIG. 5 shows the results of measurements of the magnetic moment as a function of field orientation at a fixed fieldstrength of 50 Oe. The theoretical curve for Ha/H=0.1 (open circles) is in good agreement with the experimental data (solid circles). The sharp dips in the curve occur at the in-plane hard axes of the film. The slope of the theoretical curves is discontinuous at this orientation, because the magnetization vector is inclined towards different easy axes on the two sides of the dip. The experimental data show a slight hysteresis in the vicinity of the hard-axis dips. As shown in FIG. 5, the Fe layer has a bi-axial anisotropy field without any significant superimposed uni-axial anisotropy field The values of magnetic moment are substantially equal at the dips which occur at the values of $\theta$ of 0°, 90°, 180° and equivalent angles. Moreover, the values of the magnetic moment at the peaks which occur at values of $\theta$ of 45°, 135°, 225° and equivalent angles are also substantially equal. Here, $\theta$ is the angle between the applied field and one of the hard axes (i.e. <011> axis) of the Fe layer.

Figure 5A:
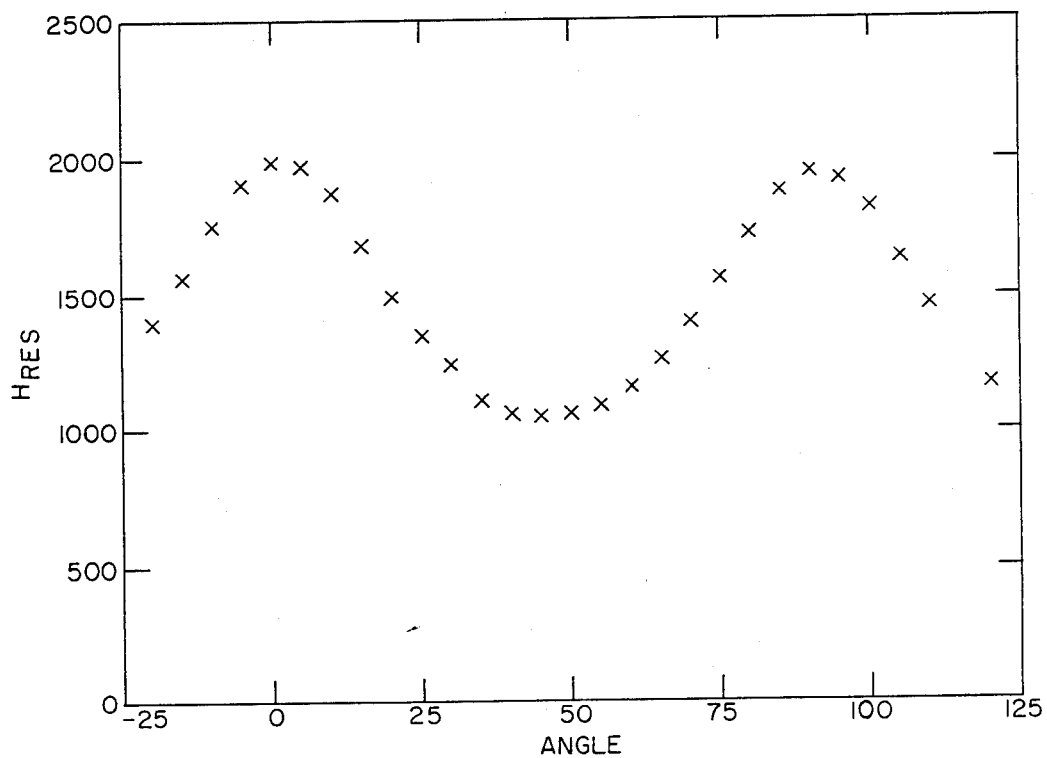
FIG. 5A is a plot of a ferromagnetic resonant field vs. orientation of a field expressed in degrees, for the film, as described in conjunction with FIG. 1.

FIG. 5A which shows ferromagnetic resonance data taken on the film, which confirms that the film has a bi-axial anisotropy field without any significant superimposed uni-axial anisotropy field. The applied ferromagnetic resonance signal had a frequency of 17.275 GHz. The X axis represents the angle in degrees between the applied field and the <011> axis of the layer. The values of the ferromagnetic resonant field, at each of the peaks are again substantially equal, and the values of the ferromagnetic resonant field at the dips are also substantially equal. This again confirms the existence of a bi-axial anisotropy field without any significant superimposed uni-axial anisotropy field.

Figure 6:
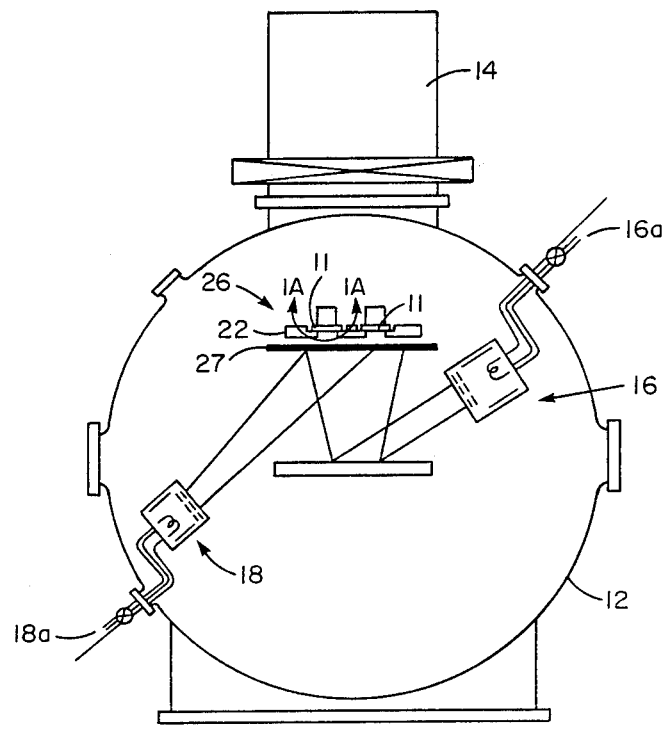
FIG. 6 is a schematic diagram of an ion beam sputtering apparatus used to grow a metal film in accordance with a further aspect of the present invention.

Referring now to FIG. 6, an alternate embodiment of an ion beam apparatus which provides high kinetic energy electrons at substantially reduced substrate temperatures is shown to include the apparatus as described in conjunction with FIG. 1, further including a second ion gun 18 fed via a second inlet port 18a as shown. Here the ion gun 18 may be used in a pre-growth step to etch the surface of the gallium arsenide substrate 11 to provide a more suitable surface for epitaxial growth of the metal layer. The gun 18 is also used during growth of the layer to provide ions having energies in the range of about 100 to 500 eV to impart an additional and variable amount of kinetic energy to the metal atoms migrating on the surface of the film and, thereby provide higher film qualities at lower substrate temperatures. It is believed that the increased amount of kinetic energy can lead to enhanced surface diffusion of the atoms on the substrate, permitting the atoms be provided in proper lattice locations on the single crystal metal film at substantially lower substrate temperatures of about 25° C. up to 355° C. preferably 25° C. to 215° C.

Having described preferred embodiments in the invention, it will now become apparent to one of the skill in the art that other embodiments incorporating their concepts may be used. It is felt, therefore, that these embodiments should not be limited to disclosed embodiments, but rather should be limited only to by the spirit and scope of the appended claims.

What is claimed is:

1. In combination:
   a layer comprising gallium arsenide having a <100> oriented surface; and
   a layer comprising a single crystal of a metal disposed on said <100> surface of the gallium arsenide.

2. The combination as recited in claim 1 wherein the metal is Fe.

3. The combination as recited in claim 2 wherein said Fe layer has an X-ray rocking curve characterized in having a single energy intensity peak at a diffraction angle corresponding to the {200} planes of the Fe layer.

4. The combination of claim 3 wherein said Fe layer has a thickness greater than about 300 Å.

5. The combination of claim 3 wherein said Fe layer has a thickness greater than about 850 Å.

6. An article comprising:
   a substrate comprising a single crystal gallium arsenide having a <100> orientated surface; and
   a layer of a single crystal of Fe disposed on said <100> of gallium arsenide, said layer of Fe having a cubic structure with a pair of mutually orthogonal <010> and <001> directions disposed in the plane of the <100> orientated surface.

7. The article of claim 6 wherein said Fe layer has a magnetic moment characteristic, relative to an angle $\theta$ where $\theta$ is the angle between an applied field and one of the pair magnetization axes of the Fe layer, said magnetic moment having a first substantially equal magnitude at $\theta$ corresponding to $\theta$=0°,90°,180° and equivalent angles thereof, and a second, different substantially equal magnitude at $\theta$ corresponding to $\theta$=45°,135°, and 225° and equivalent angles thereof.

8. The article of claim 6 wherein said Fe layer is characterized by a magnetic characteristic which has a biaxial anisotropy field without any significant uni-axial anisotropy field.

9. The article of claim 6 wherein said Fe layer is characterized by a magnetic characteristic which in response to an applied ferromagnetic resonance signal of 17.275 GHz has a ferromagnetic resonance field $H_{RES}$ which varies as a function of an angle $\theta$ between the applied field and the <011> axis of the Fe layer, substantially sinusoidially between about 1000 Oe and 2000 Oe.

10. The article of claim 8 wherein the Fe layer has a thickness greater than about 300 Å.

11. The article of claim 8 wherein the Fe layer has a thickness greater than about 850 Å.

12. An article comprising:
    a substrate of gallium arsenide having a surface of <100> crystal faces; and
    a layer of Fe having {100} crystal faces disposed on said {100} crystal faces of said gallium arsenide substrate.

13. The article of claim 12 wherein said {100} surface of GaAs is the {100} orientation, misaligned 2° within ±0.5° towards the nearest <110> axis.

14. The article of claim 13 wherein said Fe layer has a pair of <010> and <001> crystal directions disposed in a common plane on the <100> orientated substrate surface.

15. The article of claim 14 wherein said Fe layer has a natural bi-axial anisotropy magnetic field without any significant superimposed uni-axial anisotropy magnetic field.

16. An article comprising:
    a substrate of single crystal gallium arsenide having a <100> orientation surface misaligned 2° within ±0.5° towards the nearest <110> axis; and
    a layer of single crystal Fe having a selected thickness disposed on said <100> surface of gallium arsenide, having a cubic structure with a pair of mutually orthogonal <010> and <001> directions disposed in the plane of the <100> orientated surfaces, with at least a portion of the Fe layer disposed closest to the substrate having a magnetic biaxial anisotropic field without any significant superimposed uniaxial anisotropic field.

17. The article of claim 16 wherein said portion of the Fe layer has a thickness of about 570 Å.

* * * * *